(12) United States Patent
Hejtmann et al.

(10) Patent No.: US 10,991,643 B2
(45) Date of Patent: Apr. 27, 2021

(54) POWER MODULE COMPRISING A HOUSING WHICH IS FORMED IN LEVELS

(71) Applicant: Robert Bosch GmbH, Stuttgart (DE)

(72) Inventors: Georg Hejtmann, Mundelsheim (DE); Martin Rittner, Ludwigsburg (DE); Nicolas Maier, Stuttgart (DE); Uwe Glanz, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/470,970

(22) PCT Filed: Dec. 11, 2017

(86) PCT No.: PCT/EP2017/082138
§ 371 (c)(1),
(2) Date: Jun. 18, 2019

(87) PCT Pub. No.: WO2018/114411
PCT Pub. Date: Jun. 28, 2018

(65) Prior Publication Data
US 2019/0378786 A1 Dec. 12, 2019

(30) Foreign Application Priority Data
Dec. 20, 2016 (DE) .................... 10 2016 225 654.8

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4825* (2013.01); *H01L 21/565* (2013.01);
(Continued)

(58) Field of Classification Search
CPC .......... H01L 23/49562; H01L 21/4825; H01L 21/565; H01L 23/295; H01L 23/34;
(Continued)

(56) References Cited

U.S. PATENT DOCUMENTS

2009/0129028 A1* 5/2009 Son ................... H01L 23/49572
361/715
2009/0140369 A1* 6/2009 Lee ......................... H01L 24/83
257/467
2016/0240471 A1* 8/2016 Klowak .............. H01L 23/4824

FOREIGN PATENT DOCUMENTS

DE 102013112267 A1 * 11/2013 ............. H01L 23/29
DE 102013112267 5/2015
DE 102013112267 A1 * 5/2015 ......... H01L 23/3185

OTHER PUBLICATIONS

International Search Report for Application No. PCT/EP2017/082138 dated Feb. 23, 2018 (English Translation, 3 pages).

* cited by examiner

*Primary Examiner* — Edward Chin
(74) *Attorney, Agent, or Firm* — Michael Best & Friedrich LLP (57) ABSTRACT

The invention relates to a power module. The power module has at least one power semiconductor and at least one further electronic component. The power module has a housing which is formed by a shaped body and is formed by an encapsulation compound. According to the invention, the housing is formed in at least two levels. At least one power semiconductor component is arranged in a first level and the at least one further electronic component is arranged in the second level. At least one electrically conductive layer, which forms an electrically conductive connecting structure, is formed on a surface of an inner boundary of the power module which extends between the levels. The connecting
(Continued)

structure is applied directly to the surface. The at least one further electronic component is electrically conductively connected, in particular soldered or sintered, to the wiring structure. The power semiconductor component in the first level is electrically connected to the further component in the second level by means of the connecting structure.

8 Claims, 3 Drawing Sheets

(51) Int. Cl.
    *H01L 21/56*     (2006.01)
    *H01L 23/29*     (2006.01)
    *H01L 23/34*     (2006.01)
    *H01L 23/00*     (2006.01)

(52) U.S. Cl.
    CPC ............ *H01L 23/295* (2013.01); *H01L 23/34* (2013.01); *H01L 23/4951* (2013.01); *H01L 23/49568* (2013.01); *H01L 23/49575* (2013.01); *H01L 24/32* (2013.01); *H01L 24/83* (2013.01); *H01L 2224/32245* (2013.01); *H01L 2224/8384* (2013.01); *H01L 2224/83224* (2013.01); *H01L 2224/83815* (2013.01); *H01L 2924/1205* (2013.01); *H01L 2924/13055* (2013.01); *H01L 2924/13064* (2013.01); *H01L 2924/13091* (2013.01); *H01L 2924/1426* (2013.01); *H01L 2924/14252* (2013.01)

(58) Field of Classification Search
    CPC ........... H01L 23/4951; H01L 23/49568; H01L 23/49575; H01L 24/32; H01L 24/83; H01L 2224/32245; H01L 2224/83224; H01L 2224/83815; H01L 2224/8384; H01L 2924/1205; H01L 2924/13055; H01L 2924/13064; H01L 2924/13091; H01L 2924/14252; H01L 2924/1426; H01L 21/4867; H01L 23/4334; H01L 24/81; H01L 24/13; H01L 2224/92244; H01L 2224/81815; H01L 2224/8121; H01L 23/5389; H01L 24/16; H01L 2224/16245; H01L 2924/181; H01L 2224/18; H01L 24/19; H01L 24/20; H01L 2224/73267; H01L 25/072; H01L 25/16; H01L 23/3107; H01L 23/291
    See application file for complete search history.

POWER MODULE COMPRISING A HOUSING WHICH IS FORMED IN LEVELS

BACKGROUND OF THE INVENTION

The invention relates to a power module. The power module comprises at least one power semiconductor and at least one further electronic component. The power module has a housing, which is formed by a shaped body and which is formed by an encapsulation compound.

SUMMARY OF THE INVENTION

According to the invention, the housing is formed in at least two levels, in particular layers. At least one power semiconductor component is arranged in a first level, and the at least one further electronic component is arranged in the second level.

On a surface of an inner boundary, extending between the levels, of the power module, at least one electrically conductive layer, in particular a metal layer or a layer containing at least one metal particle or additionally a polymer, is formed, which layer forms an electrically conductive connection structure, in particular a wiring structure. The connection structure, in particular the wiring structure, is in particular applied directly onto the surface. The at least one further electronic component is electrically conductively connected, in particular soldered or sintered, to the wiring structure. The power semiconductor component in the first level is electrically connected to the further component in the second level by means of the connection structure. Advantageously, the power module can thus be constructed economically, insofar as a circuit carrier, for example a substrate for a circuit board, holding the connection structure may be omitted. The connection structure may, for example, be applied onto the surface, in particular the upper side, of the power module after curing of the first level. The power module may have a thermal contact face for releasing waste heat on a side of the first level, in particular a lower side, opposite thereto. The power module may thus be coupled to a heat sink.

Preferably, the power module has at least two or only two levels, three levels, four levels, or more than four levels, in which respectively at least one electronic component and/or power component, in particular a power semiconductor, is embedded. Preferably, an electrically conductive connection structure, in particular a wiring structure, is incorporated in each level which couples to a neighboring level, said structure coupling to, bearing on or being firmly connected to the surface of the neighboring level on an interface extending between the levels.

The connection structure, in particular wiring structure, is preferably formed without a circuit carrier, in particular without circuit carriers formed separately next to the levels. The wiring structure is preferably carried by the surface of one level, for example of the first level. The encapsulation compound thus advantageously forms both circuit carriers and a housing body of the power module.

The at least one further component may thus be soldered or sintered directly onto the wiring structure. The soldering or sintering process may, for example, be carried out in a reflow solder oven. After soldering of the components of the second level to the wiring structure, a further encapsulation compound, which embeds the further components, may be applied onto the first level. The aforementioned surface thus forms a boundary, in particular an interface, between the levels bearing directly on one another.

In one preferred embodiment, the power semiconductor is formed by a semiconductor switch half-bridge, and at least one further component a driver, in particular a gate driver. The further component is connected by means of the wiring structure to control terminals, in particular gate terminals, of the semiconductor switch half-bridge. The power module may thus advantageously be provided economically. For example, the power module may comprise three semiconductor switch half-bridges, which together form a B6 bridge, or comprise at least two semiconductor switch half-bridges, which together form an H bridge.

In one preferred embodiment, electrical terminals of the power semiconductor, in particular of the semiconductor switch half-bridge, are led out into the surface by means of at least one metal body, in particular via contact or metal block. More preferably, the wiring structure, in particular the metal layer, which for example forms at least one conducting track, is electrically conductively connected to the metal body. The wiring structure may, for example, be laminated onto the surface of the first level after curing of the encapsulation compound, or be formed by means of laser structuring. To this end, for example, an electrically conductive metal layer, for example a copper foil, may be applied onto the surface of the first level which is electrically conductively connected to the electrically conductive metal bodies, which respectively form a connection element to a terminal of the power semiconductor. The electrically conductive connection may, for example, be carried out by means of soldering or spot welding. The wiring structure, in particular conducting tracks, may then in a further step be formed on the surface by means of negative laser structuring.

In one preferred embodiment, the encapsulation compound is a cement compound, preferably cement composite, which is formed with the formation of cement crystals. In addition to the crystal-forming cement matrix, the cement composite comprises at least one filler, in particular filler particles. Thus, each level may be formed by a continuous crystal structure. Advantageously, the cement compound, in particular the cement composite material, has good thermal conductivity. More advantageously, a thermal expansion coefficient of the cement compound, in particular of the cement composite material, is close to an expansion coefficient of copper. Advantageously, only small thermal stresses may thus be formed in the power module. The cement starting materials are preferably designed to crystalize out from an encapsulation compound containing water, in particular from a slurry, while absorbing water. The encapsulation compound preferably comprises, in particular, hydrated calcium aluminate cement, Portland cement, phosphate cement or a combination thereof. For example, the encapsulation compound comprises calcium aluminum hydrate and/or calcium aluminate. In addition to or independently of the cement materials mentioned above, the cement matrix may be produced at least from the starting materials comprising at least one of the oxides magnesium oxide, aluminum oxide, zinc oxide, and zirconium silicate. Preferably, the cured cement comprises a phosphate, for example—depending on the starting material—zinc phosphate and/or magnesium phosphate.

Preferably, the cement matrix material has a thermal expansion coefficient of between 5 and 10, preferably of 7 ppm/K (ppm/K=parts per million per Kelvin). Advantageously, a difference from an expansion coefficient of copper as the material of the metal layers or connection structure, or of the terminals of the power semiconductor, is thus smaller compared with epoxy resin as the matrix. Copper has an expansion coefficient of 16 ppm/K, and epoxy resin about 30 ppm/K.

In another embodiment, the encapsulation compound is formed by epoxy resin. The power module may thus be provided economically for power components whose power semiconductors can generate low waste heat.

In one preferred embodiment, the encapsulation compound comprises filler particles. The filler particles are preferably ceramic particles and/or carbon particles, in particular carbon nanotubes. The ceramic particles are for example carbide particles, boride particles, nitrides or oxides. Examples of oxides are aluminum oxide, titanium dioxide, beryllium oxide or silicon oxide.

The ceramic particles which are formed from nitride are, for example, formed from at least one or a combination comprising at least two selected from the nitrides silicon nitride, aluminum nitride or boron nitride, or from all three of the aforementioned nitrides.

The ceramic particles which are formed from carbide are, for example, formed from silicon carbide, from boron carbide or from tungsten carbide. In another embodiment, the ceramic particles are by a silicide, for example molybdenum silicide, or a boride, for example titanium diboride or magnesium diboride.

The encapsulation compound preferably comprises a proportion of filler particles, in particular selected from at least one of the aforementioned filler particles, of at least sixty percent by weight, more preferably at least seventy, particularly preferably at least eighty percent by weight. The crystalline structure, which is formed by the cement crystals, preferably extends through the encapsulation compound and encloses the filler particles. Preferably, a proportion of filler particles is formed in such a way that each filler particle is fully enclosed by the crystal structure of the cement matrix—in particular with a layer that is as thin as possible.

The invention also relates to a method for producing a power module comprising at least one level. In the method, in order to form a first level of the power module, at least one power semiconductor is embedded with an encapsulation compound. Furthermore, electrical contacts are formed, which are accessible on a surface of the level after curing of the encapsulation compound. Preferably, the contacts are flush with the surface of the level or protrude from the surface of the level. In a further step, a wiring structure is applied onto the surface, which structure is electrically conductively connected to the contacts on the surface. At least one further component is applied onto the wiring structure and electrically conductively connected, in particular soldered or sintered, to the wiring structure. In a further step, the at least one further component is enclosed, in particular encapsulated, and thus embedded, with an encapsulation compound in order to form the second level. The at least one power semiconductor may thus advantageously be electrically conductively connected to the at least one further component without a circuit carrier. After the formation of the second level, the aforementioned surface of the first level forms an interface between the two levels. The encapsulation compound for forming the second level may advantageously be connected to the encapsulation compound block, which forms the first level, with a form fit, for example by a surface roughness being formed on the surface, or—for example by means of a laser—grooves or indentations, which form undercuts, being cut into the surface. The encapsulation compound, which forms the second level, may thus penetrate into the surface roughness, or into the grooves or indentations, so that after curing of the second level the encapsulation compound block of the second level is connected with a form fit and firmly to the block of the first level.

In one preferred embodiment, the further component is sintered or soldered to the wiring structure. In another embodiment, the at least one further component is ultrasonically welded to the wiring structure. The wiring structure may, for example, be predefined by means of a laser and, in a further step, applied by electroplating. In another embodiment, the wiring structure may be laminated onto the surface of the first level, and the conducting tracks may be cut out by means of laser beams.

The connection structure, in particular conducting tracks, may, in another embodiment, be produced on the surface by means of screen printing or template printing. Preferably, the connection structure is formed by an electrically conductive copper layer, silver layer or an alloy comprising copper and/or silver.

In another embodiment, the connection structure, in particular the conducting tracks, is applied onto the surface by means of dispensing a metal, or additionally a paste comprising a polymer or a ceramic, in particular a copper-containing paste, and subsequently sintering, or by means of spraying, in particular flame spraying or plasma spraying, and is thus firmly connected to the surface.

The connection structure may, in another embodiment, be formed by an electrically conductive adhesive in which electrically conductive particles are contained in an adhesive matrix.

Dispensing or spraying the connection structure has the advantage that the connection structure can be produced without touching the surface of the first or further level with a tool. For example, a connection structure, which is configured in a nonplanar fashion, or on which components or other component parts are already arranged, may be applied onto the surface.

In one preferred embodiment, at least one sensor is formed by means of the connection structure. The sensor is preferably a temperature sensor, which is formed for example by at least one conducting track that has a predetermined electrical resistance over a longitudinal section. The conducting track is preferably configured in a meandering shape. By means of the temperature sensor applied onto the surface and connected, in particular directly, to the surface, a temperature at the interface between the levels bearing on one another may advantageously be recorded. The temperature sensor is configured to produce and deliver a temperature signal representing the recorded temperature.

In another embodiment, the sensor formed by means of the connection structure is a capacitive sensor, which is configured to record moisture on the interface. Preferably, the capacitive sensor comprises two conducting tracks extending parallel to one another on the surface. Applied on the conducting tracks, there is advantageously a polymer layer which is configured to change its dielectric property as a function of moisture. The polymer is, for example, a polyimide polymer or cellulose acetate butyrate polymer. For example, by a processing unit connected to the sensor, in particular a microcontroller or a microprocessor, or by a driver, in particular a gate driver, of the power module, it is thus straightforwardly possible to record whether there is still residual moisture after the curing of the cement in the levels. The moisture sensor formed in this way is configured to generate a moisture signal representing the recorded moisture and to transmit it to the driver, or to the processing unit.

The processing unit is preferably configured to generate a PWM signal for driving the electric motor. The processing unit may modify, in particular reduce, a drive power represented by the PWM signal as a function of the temperature signal or of the moisture signal.

The power module, preferably the driver, in particular the gate driver, connected to the power semiconductor, or the processing unit, is preferably configured to switch the power semiconductor off as a function of the moisture signal and/or of the temperature signal.

Preferably, the capacitive sensor is formed by an interdigital structure formed by a plurality of extending parallel to one another, engaging in the shape of a comb.

Advantageously, by means of an interdigital structure a capacitance between the two comb structures, or additionally an electrical resistance between the structures, may be recorded by the processing unit, so that a mechanical or physical or chemical change of the encapsulation compound and/or of the connection of the levels can be recorded by the processing unit during operation of the power module at the interface extending between the levels.

In one preferred embodiment of the method, electrically conductive metal bodies are formed between terminals of the power semiconductor and the wiring structure, the upper side of which metal bodies, after formation of the first level, are accessible on a surface forming a boundary layer with the second level. Preferably, the metal bodies are flush with or protrude from the surface. The wiring structure may then be electrically connected to the metal bodies, for example with a soldering agent, in particular by reflow soldering.

In one preferred embodiment, after curing of the first level, a recess is produced which extends as far as the terminal of the semiconductor component and an electrically conductive metal body, in particular a via contact, is produced from the terminal as far as the boundary layer or interface. The metal body may, for example, be produced by electroplated filling or by a thermal spraying method, for example plasma spraying or HVOF spraying (HVOF=High-Velocity-Oxygen-Fuel).

The electrical terminal of the power semiconductor may, for example, be formed by a lead frame. The lead frame is, for example, formed by a metal plate, in particular copper plate. The power semiconductor is preferably formed by a semiconductor switch half-bridge, at least one H bridge or a B6 bridge. The semiconductor switch half-bridge preferably comprises a low-side transistor and a high-side transistor, which are respectively formed for example as a field-effect transistor. The transistors of the semiconductor switch half-bridge may, in another embodiment, be formed as an IGBT (IGBT=Insulated Gate Bipolar Transistor) or HEMT (HEMT=High Electron Mobility Transistor). The transistors are, for example, configured as packageless semiconductor bodies, also referred to as bare dies.

The power module preferably comprises electrical terminals which protrude from the power module. The electrical terminals may for example be formed by the wiring structure, parts of the wiring structure protruding from the power module and forming the electrical terminal by a protruding end section.

In another embodiment, the levels are respectively produced by means of a two-part tool, in which case the electrical terminals of the power semiconductor and/or of the further component, for example of the driver component, may protrude from the shaped body forming the level at a junction of the tool halves.

BRIEF DESCRIPTION OF THE DRAWINGS

The invention will now be explained below with the aid of figures and further exemplary embodiments. Further advantageous alternative embodiments are obtained from a combination of the features mentioned in the figures and in the dependent claims.

DETAILED DESCRIPTION

Figure 1:
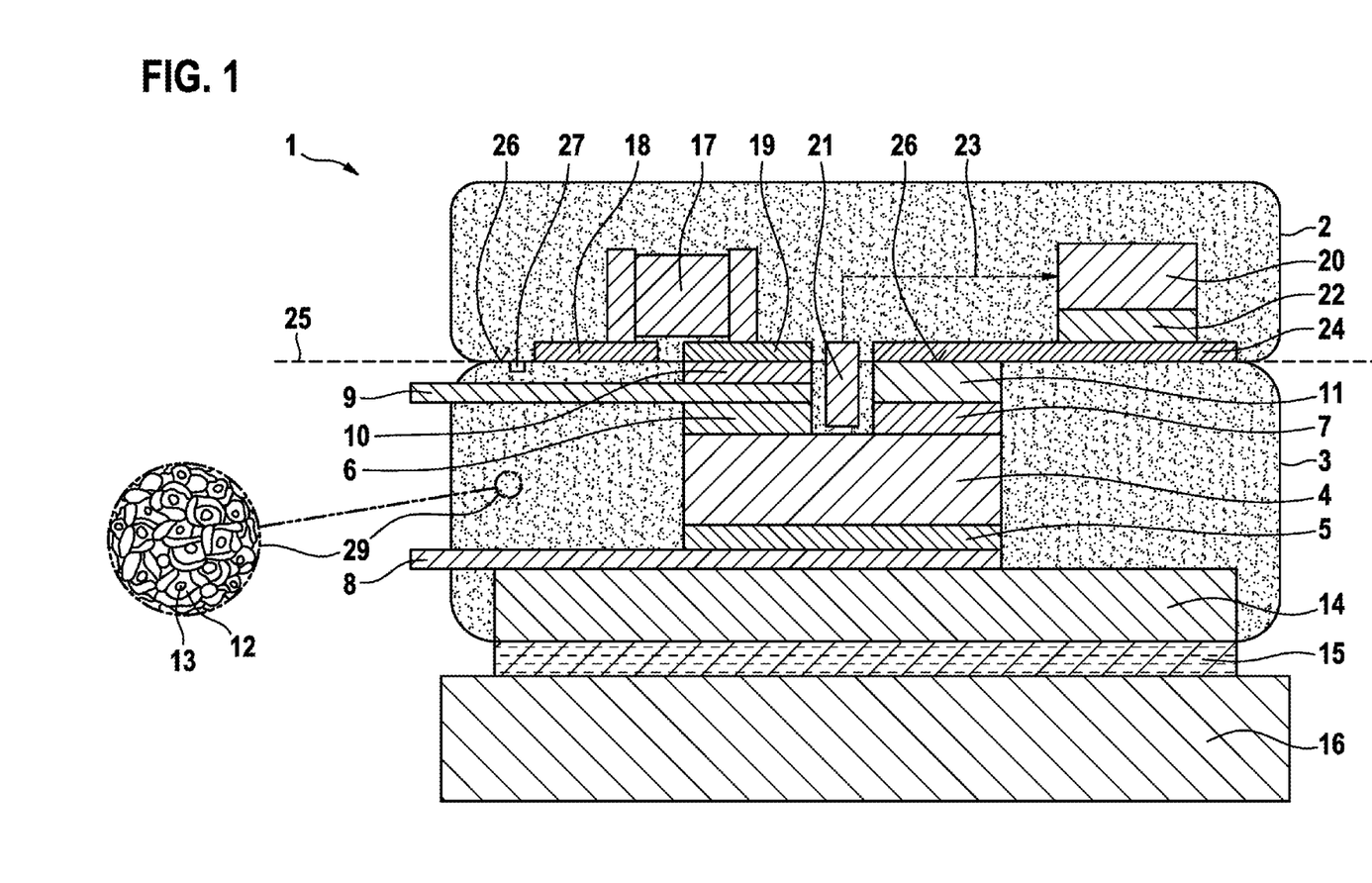
FIG. 1 shows an exemplary embodiment of a power module, which comprises a power semiconductor and a driver module as a further component part, which are respectively arranged in levels lying above one another.

FIG. 1 shows—schematically—an exemplary embodiment of a power module 1 in a sectional representation. The power module 1 comprises two levels, namely a first level 3 and a second level 2. The levels 2 and 3 are respectively formed by an encapsulation part, in particular comprising ceramic particles, which is produced from cement-bound encapsulation compound. An interface 25 extends between the levels 2 and 3. In regions on which the encapsulation bodies forming the levels 2 and 3 abut one another directly, the interface 25 forms a grain boundary for cement crystals of the first level 3 and the cement crystals of the second level 2. The cement crystals of the levels are hooked to one another with a form fit at the interface 25—depending on a surface roughness of the first level 3.

In addition to the two levels 2 and 3, the power module 1 may also comprise one or more further levels, which are electrically connected to one another.

The power module 1 comprises a power semiconductor 4, which is embedded in the encapsulation part forming the first level 3. The power semiconductor 4 is formed in this exemplary embodiment by a field-effect transistor, in particular a MISFET (MIS=Metal Insulated Semiconductor), MOSFET (MOS=Metal Oxide Semiconductor) or an IGBT (IGBT=Insulated Gate Bipolar Transistor), or an HEMT (HEMT=High Electron Mobility Transistor).

The power semiconductor 4 in this exemplary embodiment comprises a drain terminal 5 formed by a metal layer and, on an opposite side therefrom, a source terminal 6 formed by a metal layer and a control terminal 7, in particular gate terminal, formed by a metal layer. The power semiconductor 4 is soldered or sintered to the drain terminal 5 on a connecting metal plate part 8, which is formed for example by a lead frame. The source terminal 6 is connected to a further lead frame 9. The lead frames 8 and 9 respectively protrude out from the encapsulation part forming the level 3 with an end section, and thus form switching path terminals for the power semiconductor 4, which in this exemplary embodiment forms a semiconductor switch.

The lead frames 8 and 9 may respectively be arranged with the end section on a common plane, and thus protrude together in the same plane out of the encapsulation part forming the level 3.

The first level 3 may thus, for example, be produced by means of a two-part encapsulation tool.

In this exemplary embodiment a metal body 10, in this exemplary embodiment formed by a copper block, is electrically conductively connected to the metal plate part, in particular copper metal plate part, formed by the lead frame 9. The metal body 10 is in this exemplary embodiment soldered, in particular reflow soldered, or welded to the lead frame 9.

In this exemplary embodiment, the metal body 10 in the level 3 extends as far as a surface 26, which is configured for connection to a further level 2.

The surface 26 may to this end, for example, have a sufficient surface roughness or—as represented in this exemplary embodiment—comprise groove-shaped recesses produced by means of a laser, such as the recess 27, into which an encapsulation compound forming the level 2 can penetrate. The surface 26 then forms the interface 25 in regions enclosing the connection structure.

The control terminal 7 is in this exemplary embodiment connected to a metal body 11, which like the metal body 10 is flush with the surface 26. The metal body 11 may thus be externally contacted before production of the level 2. To this end, a connection structure is applied onto the surface 26. The connection structure is in this exemplary embodiment formed by electrically conductive layers or tracks, which are applied onto the surface 26, for example by means of screen printing, template printing, by means of dispensing or by means of a transfer printing method. In another embodiment, the connection structure, which in this exemplary embodiment comprises conducting tracks 18, 19 and 24, is produced on the surface 26 by means of laminating and subsequent negative laser structuring, and connected to the surface 26. A layer thickness of the conducting tracks is, for example, formed by electroplating with copper.

The conducting track 19 is in this exemplary embodiment connected to the metal body 10 by means of reflow soldering or by means of spot welding. The conducting track 24 is in this exemplary embodiment electrically conductively connected to the metal body 11 by means of soldering or welding.

An electrical terminal of a capacitance, in particular of a capacitor 17, in particular an intermediate circuit capacitor, is respectively connected, in particular soldered, to the conducting track 19 and to the conducting track 18. The capacitor 17 in this exemplary embodiment forms an aforementioned further electronic component part.

In this exemplary embodiment, a driver 20, in particular a microcontroller, FPGA (FPGA=Field Programmable Gate Array) or ASIC (ASIC=Application Specific Integrated Circuit) is also electrically conductively connected to the connection structure, in particular to the conducting track 24. The driver 20 comprises an output terminal 22, which is soldered to the conducting track 24. The terminal 22 is, for example, formed by a solder ball of a ball-grid array.

In this exemplary embodiment, the power module 1 also comprises a temperature sensor 21, which in this exemplary embodiment is embedded in the encapsulation part forming the level 3. The temperature sensor 21 protrudes as far as the surface 26, and is connected there to a conducting track 28 of the aforementioned connection structure. The temperature sensor 21 is, for example, a resistive sensor or a thermocouple. The conducting track 28 leads—represented by dashes by the connection 23—to a further terminal of the driver 20. Unlike as represented in FIG. 1, the temperature sensor may also be connected as a meandering electrical conducting track, as a constituent of the connection structure, to the surface 26. The connection 23 may be connected as a conducting track of the connection structure to the surface 26.

The lead frame 8 is in this exemplary embodiment arranged on a substrate 14, for example a ceramic substrate, and thermally conductively connected to the ceramic substrate 14. In this way, waste heat from the power semiconductor 4 can be dissipated through the lead frame 8 and the substrate. The substrate 14 is in this exemplary embodiment thermally conductively connected to a heat sink 16 by means of a thermally conductive means 15, for example a thermally conductive paste.

In this exemplary embodiment, the encapsulation part forming the level 3 is formed by a cement body, in particular a cement composite body, which is formed from cured encapsulation compound 29. The cement body or cement composite body, which forms the level 3, in this exemplary embodiment comprises a cement matrix material which is formed from cement crystals connected to one another in a crystalline fashion, of which one cement crystal 12 is denoted by way of example. The cement crystals 12 in this exemplary embodiment enclose filler particles, of which one filler particle 13 is denoted by way of example. The filler particle 13 is, for example, a ceramic filler particle.

After soldering of the further electronic component parts, such as the capacitor 17 and the driver 20, the further component parts may be encapsulated together with the connection structure with the cement compound, and thus embedded in the cement compound. In this way, after production of the level 3, the level 2 is formed which is connected to the level 3 firmly and with a form fit—in particular by means of the surface roughness or the grooves, recesses or indentations, such as the groove 27.

Figure 2:
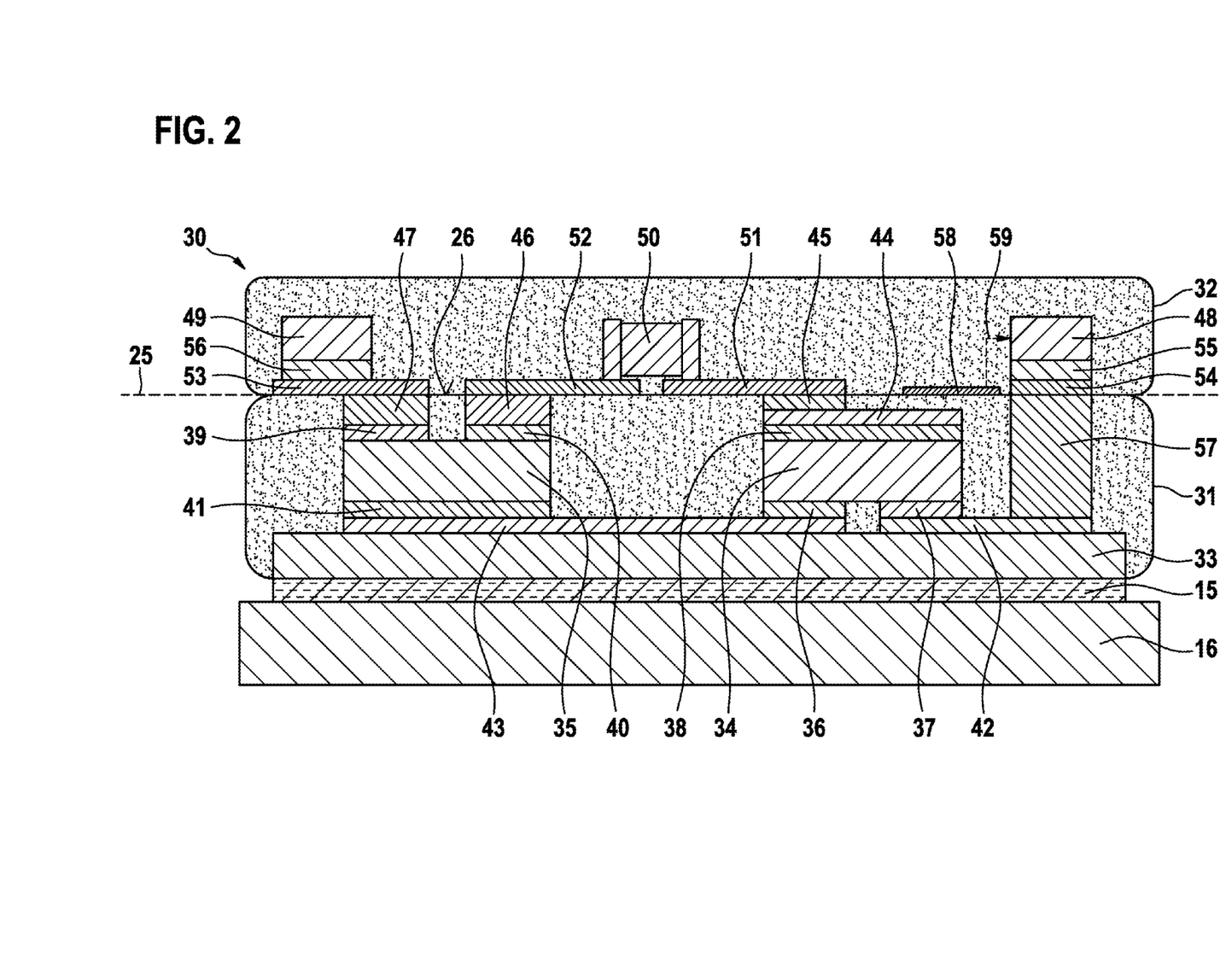
FIG. 2 shows an exemplary embodiment of a power module, which comprises a semiconductor switch half-bridge comprising two power semiconductor switches and two driver modules as further component parts, the power semiconductors being arranged in a common level and the driver modules being arranged in a level lying thereabove.

FIG. 2 shows—schematically—an exemplary embodiment of a power module 30 in a sectional representation. The power module 30 is, like the power module 1 represented in FIG. 1, formed from two levels, power semiconductors being incorporated in a first level 31, and further electronic components such as a driver 49, a driver 48 and a capacitor 50, being incorporated in a second level 32, which is firmly connected to the first level 31 by casting onto the cured first level 31.

The first level 31, which is formed by a cement encapsulation part, in this exemplary embodiment encloses a semiconductor switch 34 and a semiconductor switch 35. The semiconductor switches 34 and 35 together form a semiconductor switch half-bridge. The switching path terminals, in particular drain terminals, of the semiconductor switches 34 and 35 respectively point in mutually opposite directions. A drain terminal 41 of the semiconductor switch 35 in this exemplary embodiment points toward a substrate 33, which is thermally conductively connected to a heat sink 16 via a thermally conductive means 15, and a drain terminal 38 of the semiconductor switch 34 points toward the surface 26 of the level 31, which is configured for connection to the second level 32, formed by a cement encapsulation part.

The semiconductor switches 34 and 35 may—unlike as represented in FIG. 2—also be embedded in the first level 31 while pointing in the same direction as the drain terminals—for example toward the substrate 33.

The semiconductor switch 35 comprises a control terminal 39 and a source terminal 40, which together point to the surface 26 that is provided for connection to the second level 32. The control terminal 39 is connected to the surface 26 by means of a metal body 47. The source terminal 40 is connected to the surface 26 by means of a metal body 46. The metal bodies 46 and 47, which may for example be soldered onto the control terminal 39 or the source terminal 40, respectively, or which may be produced as a via in a cavity, may thus be contacted on the surface 26—for example by a wiring structure or a terminal of a further component. To this end, the metal body 47 is connected on the surface 26 to a conducting track 53 of a wiring structure, which is applied onto the surface 26. A conducting track 52 is electrically connected to the metal body 46. A control output terminal 56 of a driver module 59 is connected by soldering to the conducting track 53. A terminal of a filter capacitor 50 is connected by soldering to the conducting track 52.

A drain terminal 38 of the semiconductor switch 34 points toward the surface 26 and is connected to an electrically conductive layer, in particular a lead frame 44. The lead frame 44 is formed by means of a metal body 45, for example a via, or a copper block, as far as the surface 26, and may be electrically contacted there. A conducting track 51 of the aforementioned wiring structure, which is applied onto the surface 26, contacts the metal body 45 and connects it to a further terminal of the filter capacitor 50.

A drain terminal 41 of the semiconductor switch 35 and a source terminal 36 of the semiconductor switch 34, as well as a control terminal 37 of the semiconductor switch 34, respectively point toward a substrate 33. The drain terminal 41 is electrically connected to an electrically conductive layer 43, for example a lead frame, the lead frame 43 being thermally conductively connected to the substrate 33, for example a ceramic substrate. The electrically conductive layer 43 connects the drain terminal 41 to the source terminal 36 of the semiconductor switch 34. In this way, the electrically conductive layer 43 forms an output terminal of the semiconductor switch half-bridge formed by means of the semiconductor switches 34 and 35. The electrically conductive layer 43 may to this end—not represented in FIG. 2—protrude in an end section out of the shaped body forming the level 31, and may be electrically contacted there.

The control terminal 37 is electrically and thermally conductively connected to an electrically conductive layer 42, for example a lead frame. The electrically conductive layer 42 is thermally conductively connected to the substrate 33, and connects the control terminal 37 to a control output terminal 55 of a driver module 48. The driver module 48 is, like the driver module 49, incorporated in the second level 32. The electrically conductive layer 42 is electrically led out by means of a metal body 57, for example a copper block or a via produced by electroplating, to the surface 26, and may be electrically contacted there by a part of the connection structure, namely a conducting track 54. The conducting track 54 is to this end soldered or welded to the metal body 57 on the surface 26.

The power module 30 also comprises a temperature sensor 58. The temperature sensor 58 is connected on the output side by means of an electrical connection 59—represented by dashes—to the driver module 48. The temperature sensor 58 may, in addition to or independently of the electrical connection 59, also be connected to the driver module 49. The driver module 48 and/or the driver module 49 may thus switch off the semiconductor switch half-bridge in the first level 31 as a function of a temperature signal generated by the temperature sensor 58.

The temperature sensor 58 is in this example connected as a meandering electrical conducting track, in particular as a constituent of the wiring structure, to the surface 26. The connection 59 may be configured as a conducting track and—in particular as a constituent of the wiring structure—be connected to the surface 26.

The output terminals 55 and 56 of the driver modules 48 and 49, respectively, are for example configured as solder balls. The driver modules 48 and 49 may thus be soldered to the electrically conductive layers 54 and 53, respectively, by means of a soldering agent in a reflow solder oven.

The power modules represented in FIGS. 1 and 2 may respectively also comprise further levels, in which electronic components are embedded.

Figure 3:
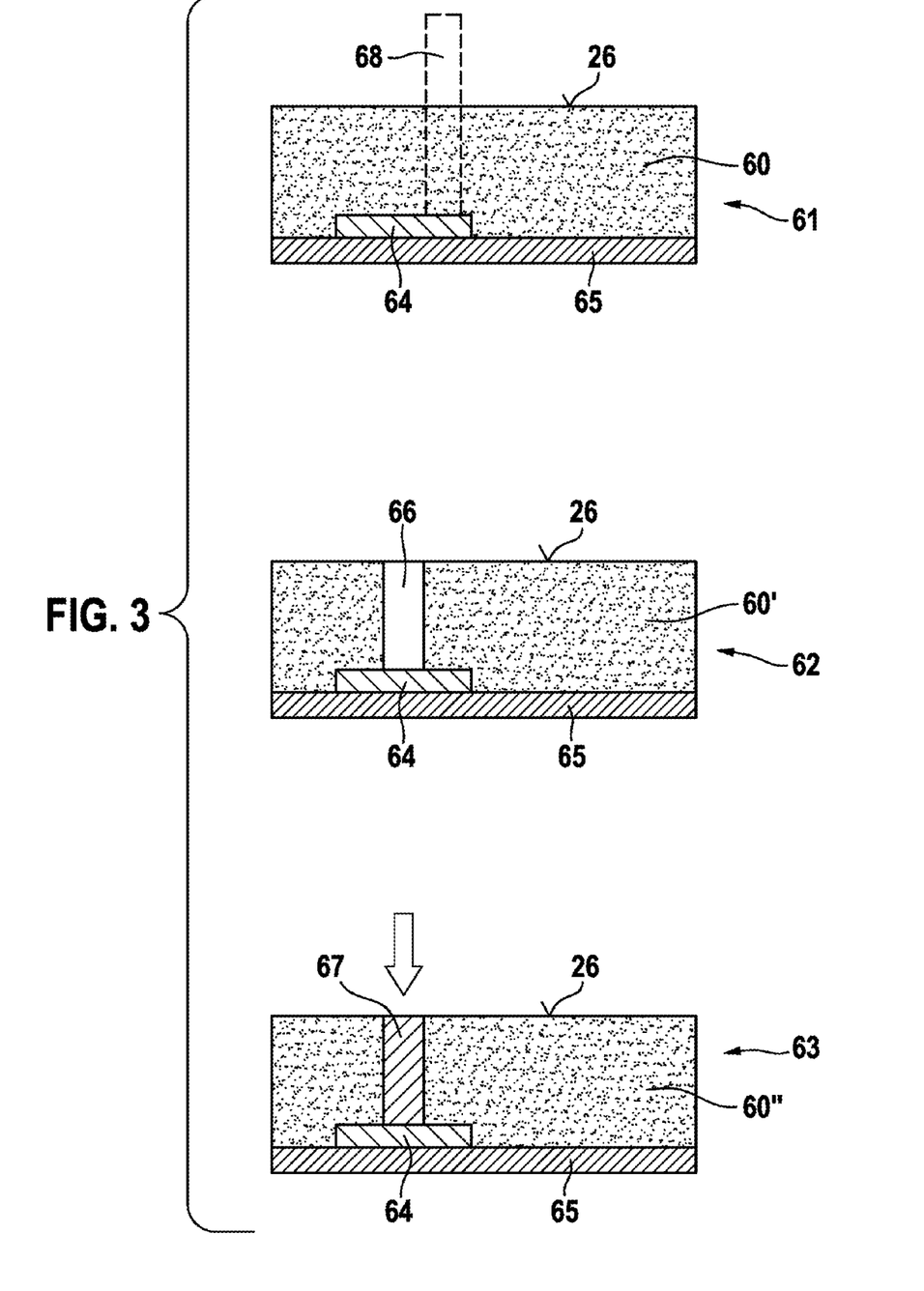
FIG. 3 shows a method for producing an electrically conductive connection transversely to a substrate plane of a substrate of the power module.

FIG. 3 shows—schematically—an exemplary embodiment of the production of a metal body in a cement-bound encapsulation part, the encapsulation part being for example formed by the first levels shown in FIGS. 1 and 2. An encapsulation part 60 is shown which is cast in a step 61 on a substrate 65, for example a ceramic substrate, or in which the substrate 65 is cast. An electrically conductive layer 64, for example a copper lead frame, is thermally conductively connected to the substrate 65.

In a step 62, a recess 66 is produced starting from the surface 26, which recess extends to the electrically conductive layer 64. The recess 66 may for example be produced by means of boring, milling, stamping or by means of laser beams.

The recess 66 may also be kept in the cement paste forming the level 60 by means of an insertion part, for example an insertion plastic part, and pulled out after curing of the cement encapsulation compound or burnt away by means of laser beams.

In a step 63, the recess 66 produced in step 62 is filled by means of an electrically conductive material, in particular copper, in this exemplary embodiment by means of a metal body 67. The metal body 67, for example a copper block, in this case electrically contacts the electrically conductive layer 64. In this exemplary embodiment, the metal body 67 is flush with the surface 26. Unlike as represented in step 63, the metal body 67 may protrude with an end section out of the surface 26. In this way, tolerances during the cement casting, shrinkage of the cement compound and/or manufacturing tolerances relating to the dimensions of the metal body 67 can be compensated for, so that the metal body 67 can be electrically contacted from the outside reliably in the region of the surface 26 by a part of a connection structure or directly by an electrical terminal of a further component.

FIG. 3 also represents in step 62—represented by dashes—an electrically conductive wire or metal body 68 which is electrically connected to the electrically conductive layer 64. The metal body 68 or wire may already also be encapsulated during the production of the encapsulation part 60 forming the first level, and protrudes with an end section beyond the surface 26. The aforementioned connection structure, or a part of the connection structure, can electrically contact the end section of the metal body 66 or wire, and thus produce an electrical connection through the first level 60 as far as the electrically conductive layer 64.

The invention claimed is:

1. A power module (1, 30), comprising
at least one power semiconductor (4, 34, 35),
at least one further electronic component (20, 48, 49, 17, 50), and
a housing, which is formed by a shaped body and which is formed by an encapsulation compound (12, 13),
wherein the housing is formed in at least first and second levels (2, 3, 31, 32), and the at least one power semiconductor component (4, 34, 35) is arranged in the first level (3, 31), and the at least one further electronic component (20, 48, 49, 17, 50) is arranged in the second level (2), at least one electrically conductive layer forming an electrically conductive connection structure (18, 19, 24, 51, 52, 53, 54) on a surface (26) of an inner interface (25), the inner interface (25) extending between the first and second levels (2, 3), of the power module, said layer being applied onto the surface (26), the at least one further electronic component (20, 48, 49, 17, 50) being electrically conductively connected to the connection structure (18, 19, 24, 51, 52, 53, 54), the power semiconductor component (4, 34, 35) in the first level (3, 31) being electrically connected to the further component in the second level (2) by the connection structure (18, 19, 24, 51, 52, 53, 54), wherein the encapsulation compound (29) is a cement compound which is formed with the formation of cement crystals (12) so that each of the first and second levels (2, 3, 31, 32) is formed by a continuous crystal structure, and wherein the connection structure forms a capacitive sensor configured to record moisture on the inner interface (25).

2. The power module (1, 30) as claimed in claim 1, characterized in that the encapsulation compound (29) comprises filler particles (13).

3. The power module (1, 30) as claimed in claim 2, characterized in that
the connection structure forms a temperature sensor (58) which is configured to record a temperature of the power module at the interface (25) and to produce a temperature signal representing the temperature, and the power module (1, 30) is configured to switch the power semiconductor (4, 34, 35) off as a function of the temperature signal.

4. The power module (1, 30) as claimed in claim 1, wherein the first and second levels are first and second layers (2, 3, 31, 32), wherein the at least one electrically conductive layer is applied directly onto the surface (26), and wherein the at least one further electronic component (20, 48, 49, 17, 50) is soldered or sintered to the connection structure (18, 19, 24, 51, 52, 53, 54).

5. The power module (1, 30) as claimed in claim 1, characterized in that the encapsulation compound (29) comprises ceramic particles.

6. The power module (1, 30) as claimed in claim 1, wherein the capacitive sensor has two conducting tracks running parallel to one another on the surface (26), and wherein a polymer layer applied on the two conducting tracks has a dielectric property and is configured to change the dielectric property as a function of the moisture.

7. The power module (1, 30) as claimed in claim 6, wherein the polymer layer is a polyimide polymer or cellulose acetate butyrate polymer.

8. The power module (1, 30) as claimed in claim 1, wherein the capacitive sensor is connected to the driver and is configured to generate a moisture signal representing the recorded moisture and to transmit it to the driver, wherein the driver is configured to switch the power semiconductor off as a function of the moisture signal.

* * * * *